(12) United States Patent
Lo et al.

(10) Patent No.: US 10,600,895 B2
(45) Date of Patent: Mar. 24, 2020

(54) POWER DEVICE

(71) Applicant: RICHTEK TECHNOLOGY CORPORATION, Zhubei, HsinChu (TW)

(72) Inventors: Kuo-Hsuan Lo, Taoyuan (TW); Tsung-Yi Huang, Hsinchu (TW)

(73) Assignee: RICHTEK TECHNOLOGY CORPORATION, Zhubei, Hasinchu (TW)

( * ) Notice: Subject to any disclaimer, the term of this patent is extended or adjusted under 35 U.S.C. 154(b) by 0 days.

(21) Appl. No.: 16/278,698

(22) Filed: Feb. 18, 2019

(65) Prior Publication Data

US 2019/0181253 A1    Jun. 13, 2019

Related U.S. Application Data

(62) Division of application No. 15/587,742, filed on May 5, 2017, now abandoned.

(30) Foreign Application Priority Data

Jan. 5, 2017  (TW) .............................. 106100300 A (51) Int. Cl.
   *H01L 29/78*    (2006.01)
   *H01L 29/739*   (2006.01)
   *H01L 29/423*   (2006.01)
   *H01L 29/06*    (2006.01)
   *H01L 29/872*   (2006.01)

(52) U.S. Cl.
   CPC ...... *H01L 29/7395* (2013.01); *H01L 29/0619* (2013.01); *H01L 29/4238* (2013.01); *H01L 29/782* (2013.01); *H01L 29/7835* (2013.01); *H01L 29/42368* (2013.01); *H01L 29/872* (2013.01)

(58) Field of Classification Search
   CPC .......... H01L 29/66348; H01L 29/7428; H01L 29/66325–66348; H01L 29/7393–7398; H01L 2924/13055; H01L 29/083–0834
   See application file for complete search history.

(56) References Cited

U.S. PATENT DOCUMENTS

2014/0084386 A1 *  3/2014  Takeda ................ H01L 29/7786
                                                        257/408

* cited by examiner

*Primary Examiner* — Tucker J Wright
(74) *Attorney, Agent, or Firm* — Tung & Associates (57) ABSTRACT

The invention provides a power device, which includes: an operation layer, including a top surface, a body region and a drift region, the body region and the drift region being connected in a lateral direction, to form a PN junction along a channel width direction between the body region and the drift region; a gate, formed on the top surface, and the PN junction is located under the gate; a source, formed in a portion of the operation layer between the body region and the top surface; a drain, formed in another portion of the operation layer between the drift region and the top surface; a first conduction portion, formed on the top surface for electrically connecting the source; a conduction layer, formed on the first conduction portion and electrically connected to the source via the first conduction portion; and a second conduction portion, formed on the top surface and between the conduction layer and the drift region in a thickness direction, for electrically connecting the drift region and the conduction layer, wherein a Schottky diode is formed by the second conduction portion and the drift region.

7 Claims, 8 Drawing Sheets

POWER DEVICE

CROSS REFERENCE

This is a Divisional of a co-pending U.S. application Ser. No. 15/587,742, filed on May 5, 2017.

The present invention claims priority to TW106100300, filed on Jan. 5, 2017.

BACKGROUND OF THE INVENTION

Field of Invention

The present invention relates to a power device, especially a power device including a Schottky diode formed by a conduction portion and a drift region, wherein the conduction portion is formed between a source and the drift region of the power device.

Description of Related Art

Conventionally, when a power device switches between conduction and non-conduction states, by the effect of a parasitic body diode of the power device, the time required for completing the switching is long and consumes more power. Besides, when such conventional power device is used in a synchronous switching regulator which includes an upper bridge switch and a lower bridge switch, an unwanted current maybe generated by the minority carriers in the power device in the lower bridge switch, causing an operation problem.

SUMMARY OF THE INVENTION

In one perspective, the present invention provides a power device, which includes: an operation layer, including a top surface, a body region of a first conductive type and a drift region of a second conductive type, the body region and the drift region are connected in a lateral direction, to form a PN junction along a channel width direction between the body region and the drift region; a gate, formed on the top surface, and the PN junction is located under the gate in a thickness direction; a source of the second conductive type, the source being formed in a portion of the operation layer between the body region and the top surface; a drain of the second conductive type, the drain being formed in a portion of the operation layer between the drift region and the top surface; a first conduction portion, formed on the top surface for electrically connecting the source; a conduction layer, formed on the first conduction portion and being electrically connected to the source via the first conduction portion; and at least one second conduction portion, formed on the top surface and between the conduction layer and the drift region in a thickness direction, to electrically connect the drift region and the conduction layer, wherein a Schottky diode is formed by the second conduction portion and the drift region; wherein the gate is located between the first conduction portion and the second conduction portion in the lateral direction.

In one embodiment, there are a plurality of second conduction portions arranged separately along the channel width direction, wherein when the power device is in a normal operation (including a conduction state and a non-conduction state), a depletion region is continuously formed without break in the drift region, to encompass a junction between the drift region and the second conduction portion under the top surface.

In one embodiment, the gate includes at least one first opening above the drift region, to accommodate the second conduction portion in the first opening.

In one embodiment, the second conduction portion is a continuous structure without break along the channel width direction.

In one embodiment, the power device further includes a field oxide structure, which is located between the drift region and the gate in the thickness direction.

In one embodiment, the field oxide structure includes at least one second opening above the drift region, to accommodate one of the second conduction portions in the second opening.

In one embodiment, the power device further includes a first conductive type shallow doped region, which is located between the field oxide structure and the drift region, and in contact with the field oxide structure.

In one embodiment, a portion of the gate is formed on the top surface and another portion of the gate is formed on the field oxide structure.

In one embodiment, the power device is used in a synchronous switching regulator configured to operably generate an output voltage according to an input voltage, wherein the power device synchronous switching regulator includes an upper bridge switch and a lower bridge switch, and the lower bridge switch includes the power device.

The objectives, technical details, features, and effects of the present invention will be better understood with regard to the detailed description of the embodiments below, with reference to the drawings.

DESCRIPTION OF THE PREFERRED EMBODIMENTS

The drawings as referred to throughout the description of the present invention are for illustrative purpose only, o show the interrelations between the layers or components, but not drawn according to actual scale.

Figure 1:
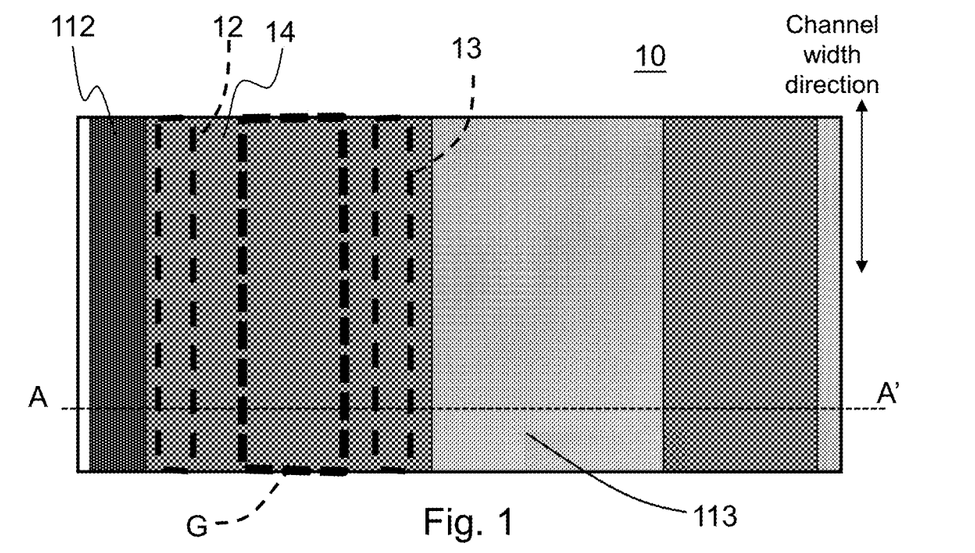
FIGS. 1 and 2 show a power device according to one embodiment of the present invention.
Figure 2:
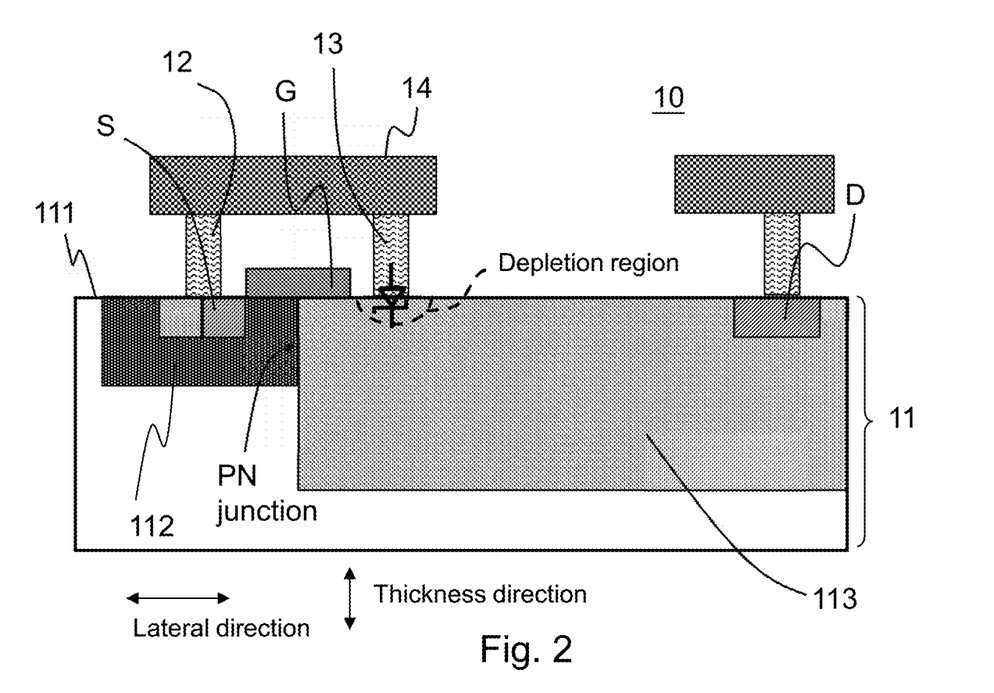

FIGS. 1 and 2 show a power device 10 according to one embodiment of the present invention, wherein FIGS. 1 and 2 respectively show a top view of the power device 10 and a cross-section view according to a cross section line AA' in FIG. 1. As shown in the figures, the power device 10 includes: an operation layer 11, including a top surface 111, a body region 112 of a first conductive type, and a drift region 113 of a second conductive type, wherein the body region 112 and the drift region 113 are connected in a lateral direction (in this embodiment, the lateral direction is a direction along the channel width), to form a PN junction along the channel width direction between the body region 112 and the drift region 113; a gate G, formed on the top surface 111, and the PN junction is located right under the gate G in a thickness direction; a source S of the second conductive type, the source S being formed in a portion of the operation layer 11 between the body region 112 and the top surface 111; a drain D of the second conductive type, the drain D being formed in a portion of the operation layer 11 between the drift region 113 and the top surface 111; a first conduction portion 12, formed on the top surface 111 for electrically connecting the source S; a conduction layer 14, formed on the first conduction portion 12 and being electrically connected to the source S through the first conduction portion 12; and at least one second conduction portion 13, formed on the top surface 111 and between the conduction layer 14 and the drift region 113 in a thickness direction, to electrically connect the drift region 113 and the conduction layer 14 (the second conduction portion 13 is electrically connected to the source S through the conduction layer 14). A Schottky diode is formed by the second conduction portion 13 and the drift region 113 (as shown by the Schottky diode symbol in FIG. 2, at a metal-semiconductor junction between the second conduction portion 13 and the drift region 113).

In one embodiment, in the lateral direction, the gate G is located between the first conduction portion 12 and the second conduction portion 13; that is, the first conduction portion 12 and the second conduction portion 13 are respectively located at two opposite sides of the gate G. The body region 112 and the drift region 113 are respectively two continuous structures without break in the channel width direction. In this embodiment, the disposition of the second conduction portion 13 does not affect the widths of the body region 112 and the drift region 133 (that is, the second conduction portion 13 does not increase the channel width of the power device 10, so the second conduction portion 13 does not increase the total width of the power device 10).

The aforementioned first conductive type can be decided according to the application of the device; for example, the first conductive type can be a P conductive type or a N conductive type. When the first conductive type is the P conductive type, the second conductive type can be the N conductive type; when the first conductive type is the N conductive type, the second conductive type can be the P conductive type.

As described in the above, when the conventional power device switches from a conduction state to a non-conduction state, an unwanted current is caused by the minority carriers in the conventional power device if it is used as a lower bridge switch, causing a problem in the operation. Contrarily, in the present invention, the Schottky diode formed by the second conduction portion 13 and the drift region 113 has a low reverse bias threshold, so the minority carriers in the parasitic body diode can flow back to the source S when the power device switches from the conduction state to the non-conduction state; the minority carriers does not affect the operation, unlike the prior art.

In the embodiment shown in FIGS. 1 and 2, in the power device 10, the second conduction portion 13 is a continuous structure without break in the channel width direction. However, the second conduction portion is not limited to this continuous structure; the power device can include plural second conduction portions 13 which are separated from each other.

Figure 3:
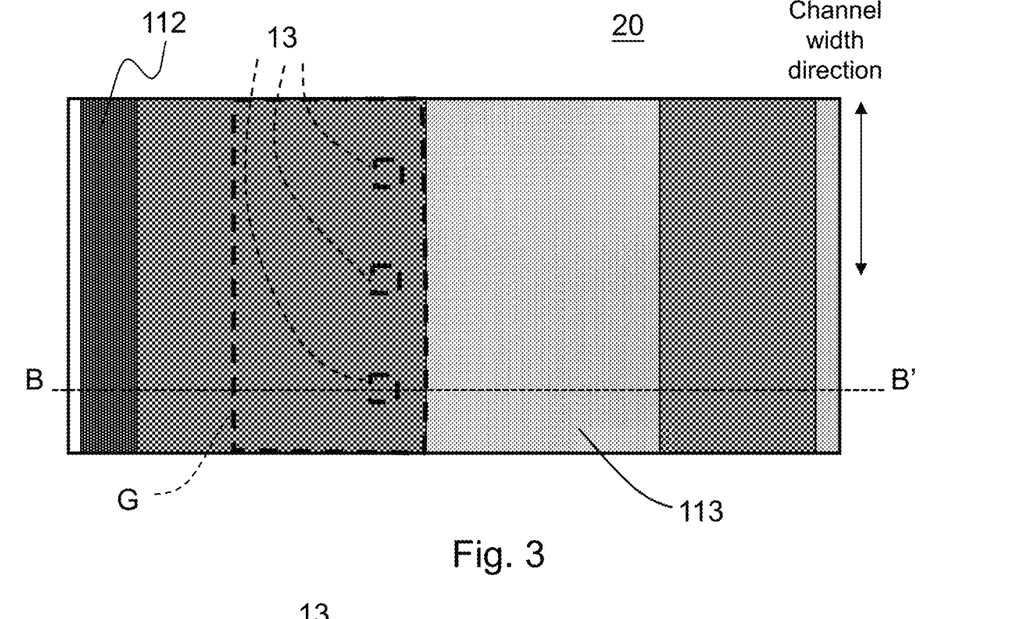
FIGS. 3 and 4 show a power device according to one embodiment of the present invention.
Figure 4:
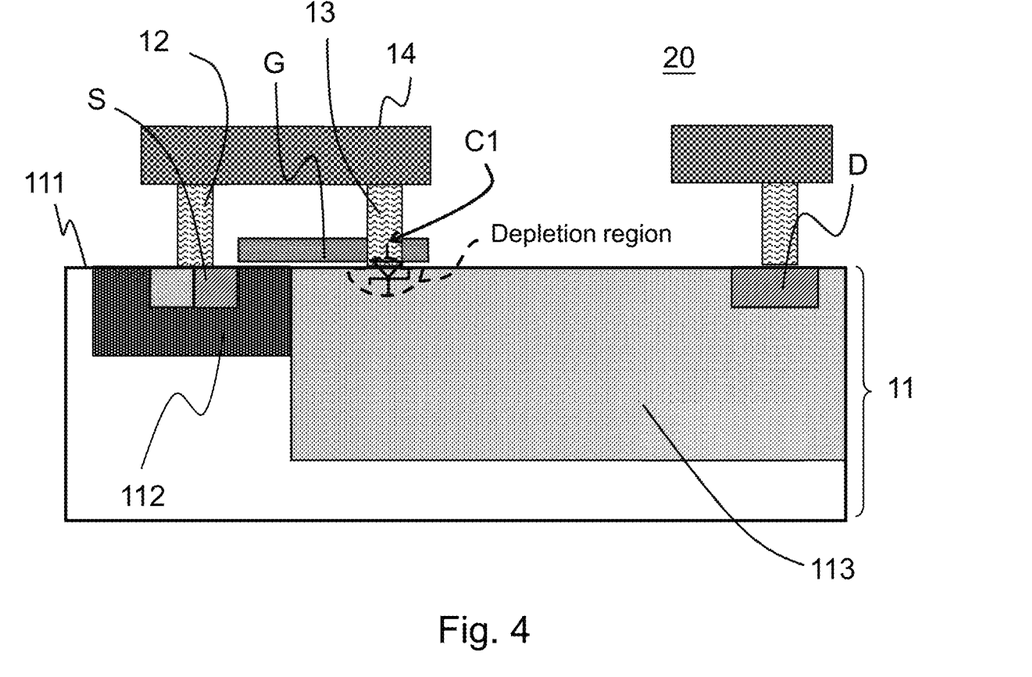

As shown in FIG. 2, when the power device 10 is in a normal operation (including a conduction state and a non-conduction state), a depletion region is continuously formed under the top surface 111 without break in the drift region 113, to encompass a junction between the drift region 113 and the second conduction portion 13. Similar phenomenon can be found when there are plural second conduction portions. FIGS. 3 and 4 show a power device 20 according to one embodiment of the present invention, wherein FIG. 3 shows a top view of the power device 20 and FIG. 4 shows a cross section view according to a cross section line BB' in FIG. 3. As shown in FIGS. 3 and 4, the power device 20 includes plural second conduction portions 13 which are arranged separately along the channel width direction. The second conduction portions 13 are separated from each other, wherein when the power device 10 is in the normal operation (including a conduction state and a non-conduction state), one depletion region is continuously formed under the top surface 111 without break in the drift region 113, to encompass all the junctions between the drift region 113 and the second conduction portions 13.

In another embodiment, optionally, there can be a first conductive type shallow doped region interposed between the second conduction portion 13 and the drift region 113, which will be explained in detail later.

Figure 5:
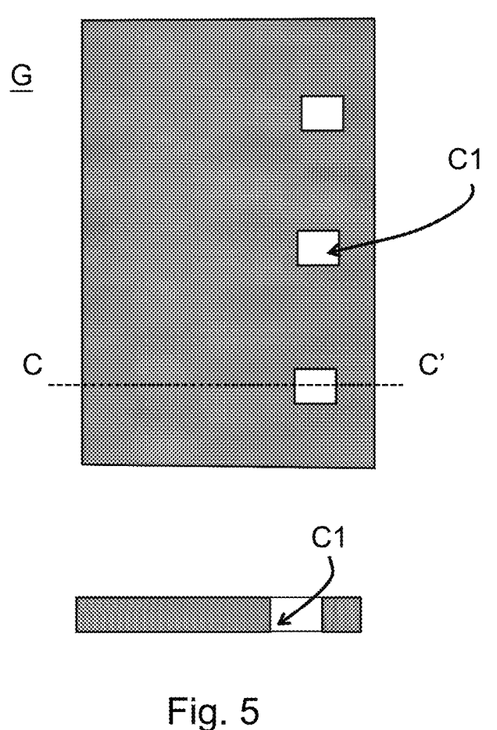
FIG. 5 shows a gate of the power device according to one embodiment of the present invention.

In the embodiment shown in FIG. 4, the gate G includes plural first openings C1 above the drift region 113. The first openings C1 accommodate the second conduction portions 13. The upper part of FIG. 5 shows a top view of the gate G of FIG. 4. The bottom part of FIG. 5 shows a cross section view of the gate G according to a cross section line CC' in the top view. The number of the first opening(s) C1 in the gate G is not limited to the number as shown in the figure. For example, in one embodiment, the gate G includes only one first opening C1 (corresponding to only one second conduction portion 13). In one embodiment, the gate G can include two or more first openings C1 (corresponding to two or more second conduction portions 13). The number of the first opening(s) C1 and the corresponding number of the second conduction portion(s) can be decided according to, for example, the requirement of the electrical characteristics or the cost and reliability of the manufacturing process, etc.

Figure 6:
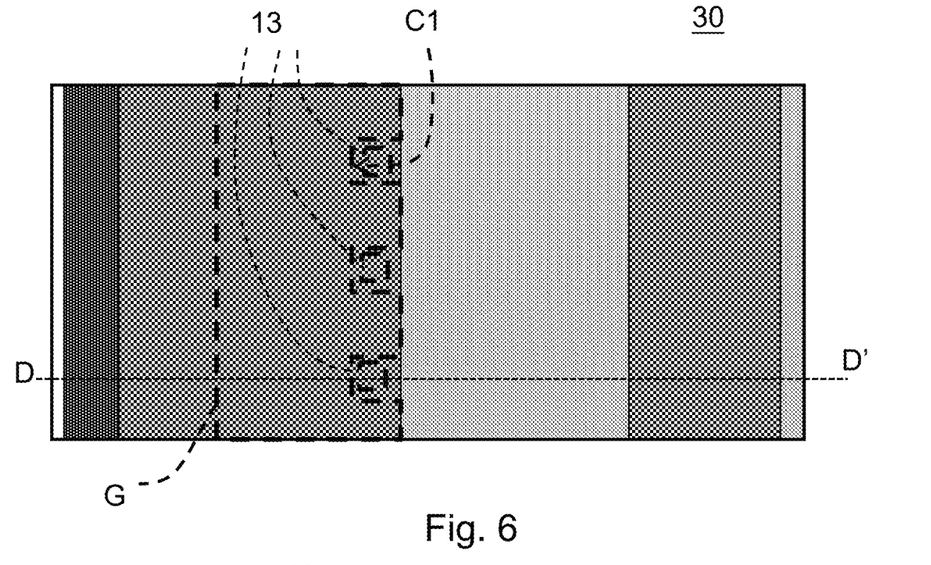
FIGS. 6 and 7 show a power device according to one embodiment of the present invention.
Figure 7:
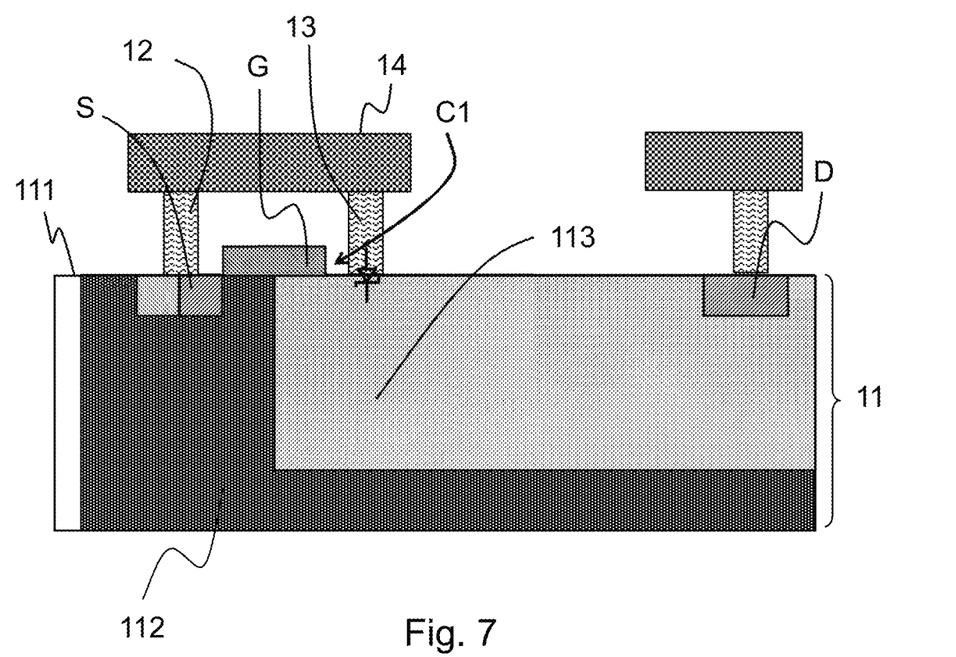
Figure 8:
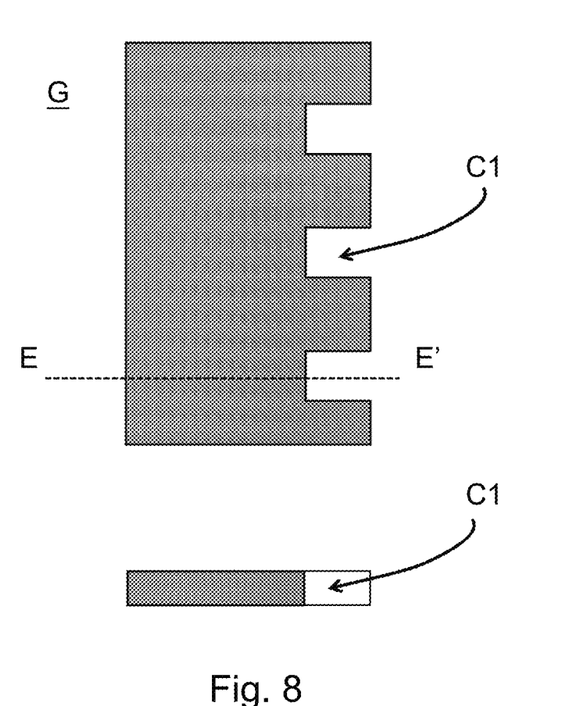
FIG. 8 shows a gate of the power device according to one embodiment of the present invention.

FIGS. 6 and 7 show a power device 30 according to one embodiment of the present invention, wherein FIG. 7 shows a cross section view according to a cross section line DD' in FIG. 6. The gate G includes plural first openings C1 above the drift region 113, to accommodate a corresponding number of the second conduction portions 13 in the first openings C1. As shown in FIGS. 6 and 7, the first openings C1 are open in one lateral side toward the drain D. The bottom part of FIG. 8 shows a top view of the gate G in FIGS. 6 and 7, and the bottom part of FIG. 8 shows a cross section view of the gate G according to a cross section line EE' in the top view. As shown in the figures, the first openings C1 respectively accommodate the corresponding second conduction portions 13. Similar to the previous embodiment, the number of the first openings C1 in the gate G is not limited to the number as shown in the figure. The gate G can include only one first opening C1 (corresponding to only one second conduction portion 13), or two or more first openings C1 (corresponding to two or more second conduction portions 13). The number of the first opening(s) C1 and the corresponding number of the second conduction portion (s) can be decided according to, for example, the requirement of the electrical characteristics or the cost and reliability of the manufacturing process, etc.

In the embodiment shown in FIG. 7, another feature which is different from the previous embodiment is that the drift region 113 is located on a portion of the body region 112 in the thickness direction.

Figure 9:
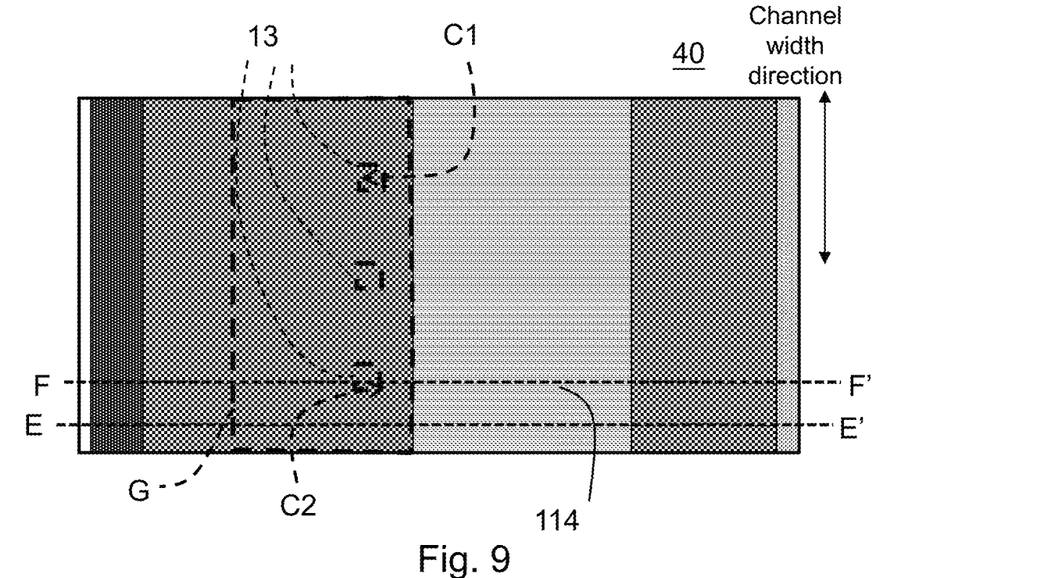
FIGS. 9, 10, and 11 show a power device according to one embodiment of the present invention.
Figure 10:
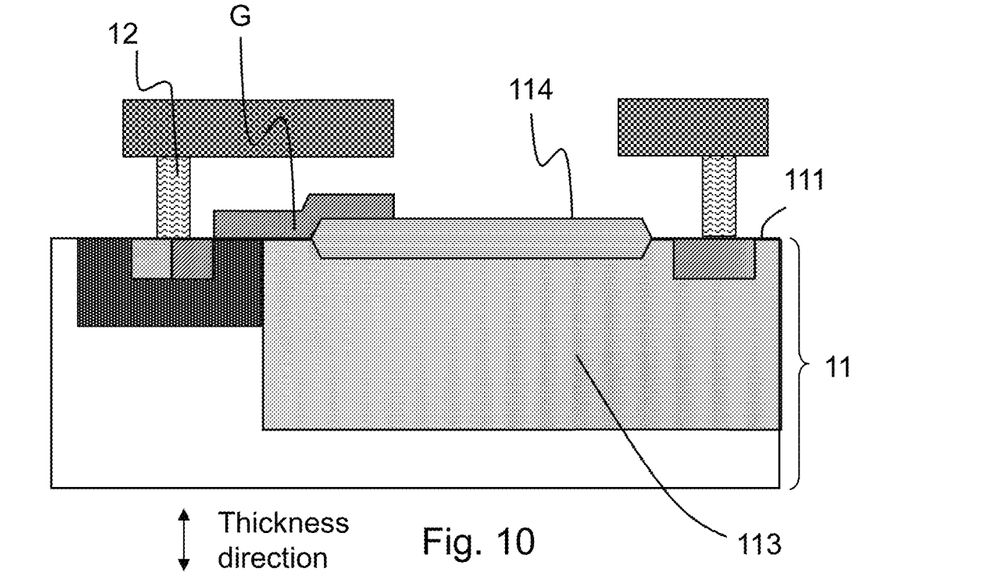
Figure 11:
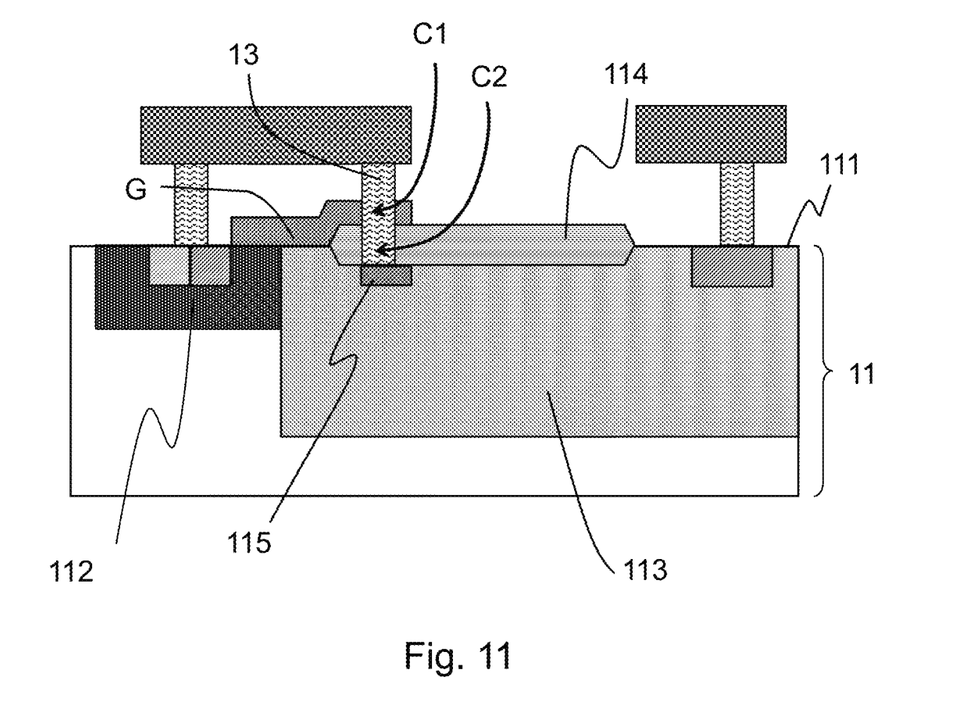

FIGS. 9, 10, and 11 show a power device 40 according to one embodiment of the present invention, wherein FIG. 10 shows a cross section view according to a cross section line EE' in FIG. 9, and FIG. 11 shows another cross section view according to a cross section line FF' in FIG. 9. According to the figures, the power device 40 includes a field oxide structure 114, which is located between the drift region 113 and the gate G in the thickness direction. The field oxide structure 114 is shown to be a structure formed by local oxidation of silicon (LOCOS structure), but it can be replaced by a structure formed by shallow trench isolation (STI structure).

FIGS. 10 and 11 show that, in this embodiment of the present invention, a portion of the gate G is formed on the top surface 111 and another portion of the gate G is formed on the field oxide structure 114.

As shown in FIG. 11, the field oxide structure 114 includes at least one second opening C2, to accommodate a corresponding one of the second conduction portions in the second opening C2. Note that the number of the second opening(s) C2 is not limited to the number as shown in FIG. 9. The field oxide structure 114 can include only one second opening C2 (corresponding to only one second conduction portion 13, or two or more second openings C2 (corresponding to two or more second conduction portions 13). The number of the second openings C2 and the corresponding number of the second conduction portion(s) can be decided according to, for example, the requirement of the electrical characteristics or the cost and reliability of the manufacturing process, etc.

As shown in FIG. 11, in one embodiment, the power device 40 can further include a first conductive type shallow doped region 115, which is formed between the field oxide structure 114 and the drift region 113, and the first conductive type shallow doped region 115 is in contact with the field oxide structure 114. The first conductive type shallow doped region 115 is optional, for adjusting a channel length of the power device 40. The device designer can decide to include this first conductive type shallow doped region 115 or not. The first conductive type shallow doped region 115 can be designed to separate the drift region 113 and the second conduction portion 13 completely or partially.

Figure 12:
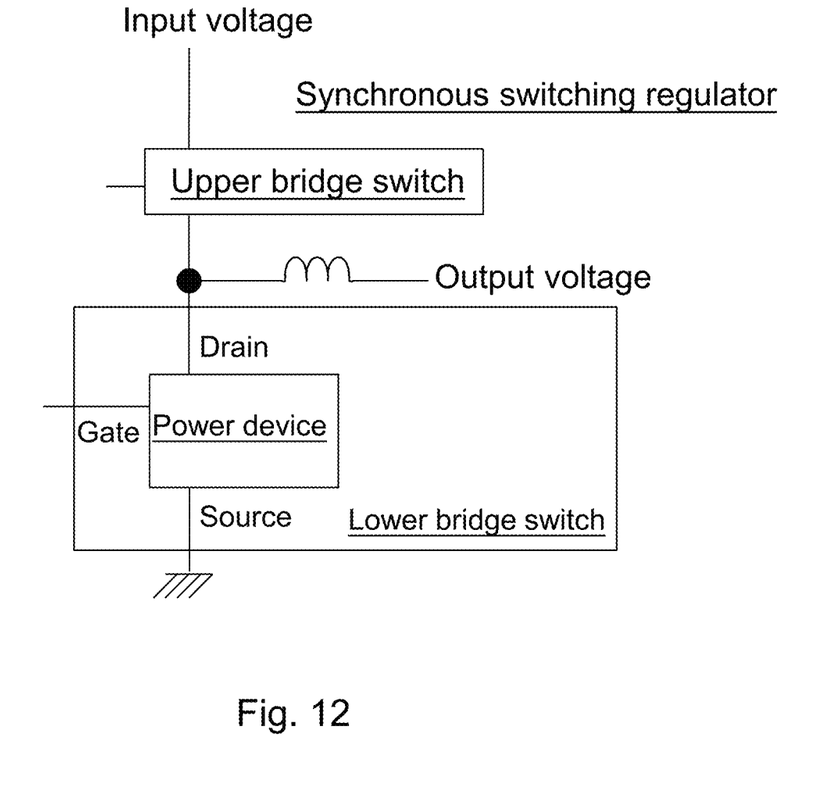
FIG. 12 shows a synchronous switching regulator including a power device according to one embodiment of the present invention.

FIG. 12 shows one embodiment of the present invention, wherein the power device is used in a synchronous switching regulator, which is configured to operably generate an output voltage according to an input voltage. The power device includes an upper bridge switch and a lower bridge switch, wherein the lower bridge switch includes the power device of the present invention. The drain and the source shown in FIG. 12 correspond to the drain and the source of the power device in the aforementioned embodiments of the present invention, or correspond to electrical connections with the drain and the source of the power device in the aforementioned embodiments of the present invention. The present invention is different from the conventional power device in that, when the power device of the present invention is used as the lower bridge switch and when the lower bridge switch switches from the conduction state to the non-conduction state, the minority carriers in the parasitic body diode can flow through the Schottky diode back to the source S, to avoid the aforementioned unwanted current of the conventional power device.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. Besides, an embodiment or a claim of the present invention does not need to attain or include all the objectives, advantages or features described in the above. The abstract and the title are provided for assisting searches and not to be read as limitations to the scope of the present invention. It is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment.

What is claimed is:

1. A power device, comprising:
an operation layer, including a top surface, a body region of a first conductive type and a drift region of a second conductive type, the body region and the drift region are connected in a lateral direction, to form a PN junction along a channel width direction between the body region and the drift region;
a gate, formed on the top surface, and the PN junction is located under the gate in a thickness direction;
a source of the second conductive type, the source being formed in a portion of the operation layer between the body region and the top surface;
a drain of the second conductive type, the drain being formed in a portion of the operation layer between the drift region and the top surface;
a first conduction portion, formed on the top surface for electrically connecting the source;
a conduction layer, formed on the first conduction portion and being electrically connected to the source via the first conduction portion; and
a plurality of second conduction portions, formed on the top surface and between the conduction layer and the drift region in a thickness direction, and arranged separately along the channel width direction, to electrically connect the drift region and the conduction layer, wherein at least one Schottky diode is formed by the second conduction portions and the drift region;
wherein the gate is located between the first conduction portion and the second conduction portions in the lateral direction; and
wherein when the power device is in a normal operation including a conduction state and a non-conduction state, a depletion region is continuously formed without break in the drift region, to encompass a junction between the drift region and the second conduction portions under the top surface.

2. The power device of claim 1, wherein the gate includes at least one first opening above the drift region, to accommodate the second conduction portion in the first opening.

3. The power device of claim 1, further comprising a field oxide structure, which is located between the drift region and the gate in the thickness direction.

4. The power device of claim 3, wherein the field oxide structure includes at least one second opening above the drift region, to accommodate one of the second conduction portions in the second opening.

5. The power device of claim 3, further comprising a first conductive type shallow doped region, which is located between the field oxide structure and the drift region, and in contact with the field oxide structure.

6. The power device of claim 3, wherein a portion of the gate is formed on the top surface and another portion of the gate is formed on the field oxide structure.

7. The power device of claim 1, wherein the power device is used in a synchronous switching regulator which is configured to operably generate an output voltage according to an input voltage, wherein the power device includes an upper bridge switch and a lower bridge switch, and the lower bridge switch includes the power device.

\* \* \* \* \*